(12) United States Patent
Bae et al.

(10) Patent No.: US 11,391,780 B2
(45) Date of Patent: Jul. 19, 2022

(54) BATTERY DIAGNOSTIC DEVICE AND METHOD

(71) Applicant: LG Chem, Ltd., Seoul (KR)

(72) Inventors: Yoon-Jung Bae, Daejeon (KR); Dae-Soo Kim, Daejeon (KR); Ji-Yeon Kim, Daejeon (KR); Dong-Kyu Kim, Daejeon (KR); Jae-Hyun Lee, Daejeon (KR)

(73) Assignee: LG Energy Solution, Ltd.

( * ) Notice: Subject to any disclaimer, the term of this patent is extended or adjusted under 35 U.S.C. 154(b) by 56 days.

(21) Appl. No.: 16/643,941

(22) PCT Filed: Apr. 10, 2019

(86) PCT No.: PCT/KR2019/004287
§ 371 (c)(1),
(2) Date: Mar. 3, 2020

(87) PCT Pub. No.: WO2019/199057
PCT Pub. Date: Oct. 17, 2019

(65) Prior Publication Data
US 2020/0408846 A1    Dec. 31, 2020

(30) Foreign Application Priority Data

Apr. 10, 2018    (KR) .................. 10-2018-0041690

(51) Int. Cl.
*G01R 31/3842* (2019.01)
*G01R 31/392* (2019.01)
(Continued)

(52) U.S. Cl.
CPC ....... *G01R 31/3842* (2019.01); *G01R 31/392* (2019.01); *H01M 10/425* (2013.01);
(Continued)

(58) Field of Classification Search
CPC .. G01R 31/36; G01R 31/382; G01R 31/3842; G01R 31/389; G01R 31/392;
(Continued)

(56) References Cited

U.S. PATENT DOCUMENTS 8,741,459 B2    6/2014  Okumura et al.
9,461,490 B2    10/2016  Ying
(Continued)

FOREIGN PATENT DOCUMENTS

CN      1437031 A    8/2003
CN    104237800 A    12/2014
(Continued)

OTHER PUBLICATIONS

Coleman, et al., "State-of-Charge Determination From EMF Voltage Estimation: Using Impedance, Terminal Voltage, and Current for Lead-Acid and Lithium-Ion Batteries," IEEE Transactions on Industrial Electronics, Oct. 1, 2007, pp. 2550-2557, vol. 54, No. 5, IEEE Service Center, Piscataway, NJ, USA.
(Continued)

*Primary Examiner* — Kyle R Quigley
(74) *Attorney, Agent, or Firm* — Lerner, David, Littenberg, Krumholz & Mentlik, LLP

(57) ABSTRACT

A battery diagnostic device includes a sensing unit configured to measure a current and voltage of a battery, and a processor configured to estimate a SOC of the battery based on the measured current, select a plurality of SOCs from SOC-voltage data mapping the voltage and the estimated SOC with each other, divide a preset SOC region into a plurality of sub-regions based on sizes of the selected SOCs, calculate a region change value of each of the sub-regions based on the sizes of the sub-regions and a size of a preset reference region, diagnose whether at least one of an active material area, a depth of discharge and a depth of charge of
(Continued)

the battery changes based on the calculated change values of sub-regions, and determine whether a mode of the battery is a normal mode or a failure mode based on the diagnosis.

16 Claims, 6 Drawing Sheets

(51) Int. Cl.
*H01M 10/42* (2006.01)
*H01M 10/48* (2006.01)

(52) U.S. Cl.
CPC ....... *H01M 10/4285* (2013.01); *H01M 10/48* (2013.01); *H01M 2010/4271* (2013.01)

(58) Field of Classification Search
CPC ............... H01M 10/42; H01M 10/425; H01M 10/4285; H01M 10/48; H01M 2010/4271
See application file for complete search history.

(56) References Cited

U.S. PATENT DOCUMENTS

| | | | |
|---|---|---|---|
| 2006/0273763 | A1 | 12/2006 | Arai et al. |
| 2011/0012604 | A1* | 1/2011 | Tsujiko ................. H01M 4/587 |
| | | | 324/427 |
| 2011/0313613 | A1 | 12/2011 | Kawahara et al. |
| 2011/0313699 | A1 | 12/2011 | Hirai et al. |
| 2012/0293131 | A1 | 11/2012 | Nakamura et al. |
| 2012/0328728 | A1 | 12/2012 | Nakatsuka et al. |
| 2013/0314050 | A1* | 11/2013 | Matsubara ................. H02J 7/00 |
| | | | 320/134 |
| 2014/0236509 | A1 | 8/2014 | Kim |
| 2015/0051854 | A1 | 2/2015 | Joe et al. |
| 2015/0066407 | A1 | 3/2015 | Joe et al. |
| 2015/0084639 | A1 | 3/2015 | Joe |
| 2015/0100260 | A1 | 4/2015 | Joe et al. |
| 2016/0103185 | A1 | 4/2016 | Chang et al. |
| 2016/0299197 | A1 | 10/2016 | Kim |
| 2017/0234930 | A1 | 8/2017 | Lee et al. |
| 2017/0361729 | A1 | 12/2017 | Bryngelsson et al. |
| 2018/0203071 | A1* | 7/2018 | Takemura ........... H01M 4/5825 |

FOREIGN PATENT DOCUMENTS

| | | |
|---|---|---|
| CN | 104364669 A | 2/2015 |
| CN | 104541175 A | 4/2015 |
| CN | 104662432 A | 5/2015 |
| CN | 104931882 A | 9/2015 |
| CN | 105510832 A | 4/2016 |
| CN | 107406004 A | 11/2017 |
| JP | 2004301779 A | 10/2004 |
| JP | 2009113636 A | 5/2009 |
| JP | 201019664 A | 1/2010 |
| JP | 2010257984 A | 11/2010 |
| JP | 2015121520 A | 7/2015 |
| JP | 2016126887 A | 7/2016 |
| JP | WO2017010475 A1 | 11/2017 |
| KR | 20110084633 | 7/2011 |
| KR | 20130122543 A | 11/2013 |
| KR | 20140104893 A | 8/2014 |
| KR | 20170023583 A | 3/2017 |
| KR | 20170073314 A | 6/2017 |

OTHER PUBLICATIONS

Extended European Search Report for Application No. 19785913.5 dated Aug. 17, 2020, 6 pages.
International Search Report from Application No. PCT/KR2019/004287 dated Jul. 29, 2019, 2 pages.
Search Report for Chinese Application No. 201980005216.8 dated Oct. 8, 2021. 3 pgs.

* cited by examiner

BATTERY DIAGNOSTIC DEVICE AND METHOD

CROSS-REFERENCE TO RELATED APPLICATIONS

The present application is a national phase entry under 35 U.S.C. § 371 of International Application No. PCT/KR2019/004287 filed Apr. 10, 2019, published in Korean, which claims priority from Korean Patent Application 10-2018-0041690 filed Apr. 10, 2018, all of which are incorporated herein by reference.

TECHNICAL FIELD

The present disclosure relates to a battery diagnostic device and method, and more particularly, to a battery diagnostic device and method for diagnosing a change of at least one of an active material area, a depth of discharge and a depth of charge of a battery.

BACKGROUND ART

A secondary battery generates electric energy through electrochemical oxidation and reduction reactions and is used in a wide variety of applications. For example, the use area of the secondary battery is gradually expanding to portable devices capable of being carried in a human hand, such as a cellular phone, a laptop computer, a digital camera, a video camera, a tablet computer, or a power tool; various electricity-driven devices such as an electric bicycle, an electric motorcycle, an electric vehicle, a hybrid electric vehicle, an electric boat, or an electric plane; power storage devices used for storing power generated by renewable energy or surplus generated power; power supply devices for stably supplying power to various information communication devices including a server computer and a base station for communication; and the like.

The secondary battery includes three basic components, namely a negative electrode (anode) containing a substance that is oxidized while discharging electrons during discharge, a positive electrode (cathode) containing a substance that is reduced while accepting electrons during discharge, and an electrolyte that allows ion transfer between the negative electrode and the positive electrode. The battery may be classified as a primary battery that is not reusable after being discharged and a secondary battery that allows repeated charging and discharging since the electrochemical reaction is at least partly reversible.

Examples of secondary batteries known in the art include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries, and the like. Among them, the lithium secondary batteries have attracted the greatest commercial interest due to their high energy density, high battery voltage and long life, compared to other secondary batteries.

Meanwhile, an electronic device employing the secondary battery generally has a function of informing a residual usage amount by using a State of Charge (SOC) of the secondary battery. The SOC of the secondary battery is usually obtained according to SOC-voltage data on the change pattern of SOC, caused by the change of voltage of the secondary battery. Here, the voltage of the secondary battery may be an open circuit voltage of the secondary battery.

The SOC-voltage data is not only dependent on the type and capacity of the applied secondary battery but also dependent on the degradation due to use even when the type or capacity of the secondary battery is specified.

More specifically, the SOC-voltage data depends on the degradation, capacity design and type of active material of each of the positive electrode and the negative electrode of the secondary battery.

In the conventional technique for diagnosing a secondary battery by using the SOC-voltage data, only the degradation of the secondary battery is diagnosed, and it is impossible to diagnose an active material area, a depth of discharge and a depth of charge of the secondary battery.

SUMMARY

Technical Problem

The present disclosure is directed to providing a battery diagnostic device and method for diagnosing a change of at least one of an active material area, a depth of discharge and a depth of charge of a battery based on a change of regional size of a preset SOC region calculated according to the state of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery diagnostic device, comprising: one or more sensors configured to measure a current and voltage of a battery; and a processor configured to estimate an estimated State of Charge of the battery based on the current measured by the one or more sensors, select a plurality of selected SOCs according to a predetermined condition from SOC-voltage data mapping the voltage measured by the one or more sensors with the estimated SOC, divide a preset SOC region into a plurality of sub-regions based on a size of the plurality of selected SOCs, each sub-region having a size, for each sub-region, calculate a region change value of the sub-region based on the size of the sub-region and a size of a preset reference region, determine whether at least one of an active material area, a depth of discharge or a depth of charge of the battery is changed based on the calculated region change values of the plurality of sub-regions, and determine a mode of the battery based on whether at least one of the active material area, the depth of charge or the depth of discharge is changed, wherein the mode of the battery is one of a normal mode or a failure mode.

The processor may be configured to obtain a SOC-voltage curve from the SOC-voltage data, extract a plurality of inflection points from the obtained SOC-voltage curve, and select the plurality of selected SOCs from at least some of the plurality of extracted inflection points.

The plurality of sub-regions may include a first sub-region, a second sub-region and a third sub-region, and the processor may be configured to select a SOC having a smallest size among the plurality of selected SOCs as a first SOC, select a SOC having a largest size among the plurality of selected SOCs as a second SOC, and divide the preset SOC region into the first sub-region, the second sub-region and the third sub-region based on points corresponding to the first SOC and the second SOC in the preset SOC region.

The processor may be configured to calculate a second region change value based on a difference between a size of the second sub-region and a size of a second reference region of the preset reference region, and determine whether the active material area of the battery is changed based on the calculated second region change value.

The processor may be configured to calculate the second region change value according to:

$$Q_{vp-p} = \left(\frac{Q_{p-p} - Q_{rp-p}}{Q_{rp-p}}\right) \times 100$$

wherein Qvp-p is the second region change value, Qp-p is the size of the second sub-region, and Qrp-p is the size of the preset second reference region.

The processor may be configured to determine whether the active material area of the battery is changed based on the calculated second region change value is within a preset predetermined active material area change range, and determine that the mode of the battery is a failure mode when it is determined that the active material area is changed.

The processor may be configured to calculate a first region change value based on a size of the first sub-region, a size of a preset first reference region and the calculated second region change value, and determine whether the depth of discharge of the battery is changed based on the calculated first region change value.

The processor may be configured to calculate the first region change value according to:

$$Q_{veod} = \left(\frac{Q_{eod} - Q_{reod}}{Q_{reod}}\right) \times 100 - Q_{vp-p}$$

wherein Qveod is the first region change value, Qeod is the size of the first sub-region, Qreod is the size of the preset first reference region, and Qvp-p is the second region change value.

The processor may be configured to determine whether the depth of discharge of the battery is changed based on whether the calculated first region change value is within a preset predetermined depth-of-discharge change range, and determine that the mode of the battery is a failure mode when it is determined that the depth of discharge is changed.

The processor may be configured to calculate a third region change value based on a size of the third sub-region, a size of a preset third reference region and the calculated second region change value, and determine whether the depth of charge of the battery is changed based on the calculated third region change value.

The processor may be configured to calculate the third region change value according to:

$$Q_{veoc} = \left(\frac{Q_{eoc} - Q_{reoc}}{Q_{reoc}}\right) \times 100 - Q_{vp-p}$$

wherein Qveoc is the third region change value, Qeoc is the size of the third sub-region, Qreoc is the size of the preset third reference region, and Qvp-p is the second region change value.

The processor may be configured to determine whether the depth of charge of the battery is changed based on whether the calculated third region change value is within a preset predetermined depth-of-charge change range, and determine that the mode of the battery is a failure mode when it is determined that the depth of charge is changed.

A battery management system according to another embodiment of the present disclosure may comprise the battery diagnostic device according to any of the embodiments of the present disclosure.

A battery pack according to another embodiment of the present disclosure may comprise the battery diagnostic device according to any of the embodiments of the present disclosure.

A battery diagnostic method according to another embodiment of the present disclosure may comprise: measuring a current and voltage of a battery and estimating an estimated SOC of the battery based on the measured current; selecting a plurality of selected SOCs according to a predetermined condition from SOC-voltage data mapping the measured voltage with the estimated SOC; dividing a preset SOC region into a plurality of sub-regions based on a size of the plurality of selected SOCs, each sub-region having a size; for each sub-region, calculating a region change value of the sub-region based on the size of the sub-region and a size of a preset reference region; determine whether at least one of an active material area, a depth of discharge or a depth of charge of the battery is changed based on the calculated region change values of the plurality of sub-regions; and determining a mode of the battery based on whether at least one of the active material area, the depth of charge or the depth of discharge is changed, wherein the mode of the battery is one of a normal mode or a failure mode.

Advantageous Effects

According to the present disclosure, a change of a SOC region may be determined based on SOC and voltage of a battery, and a change of at least one of an active material area, a depth of discharge and a depth of charge of the battery may be diagnosed through the determined change of region.

In addition, according to the present disclosure, since the change of at least one of the active material area, the depth of discharge and the depth of charge of the battery is diagnosed, it is possible to determine whether the mode of the battery is included in a normal mode or a failure mode.

That is, according to the present disclosure, the cause of degeneration of each battery may be specifically diagnosed, and the mode of the battery may be classified into a normal mode or a failure mode.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term <processor> described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
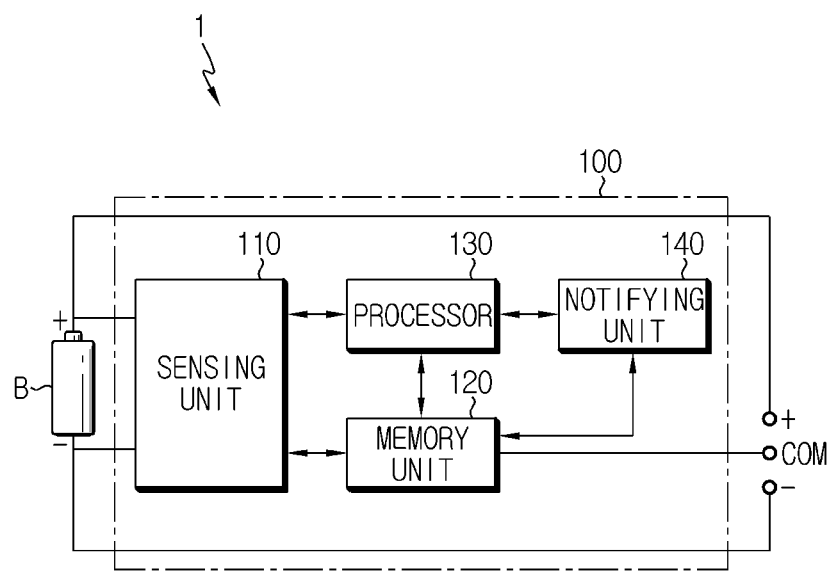
FIG. 1 is a diagram showing a battery diagnostic device according to an embodiment of the present disclosure.
Figure 2:
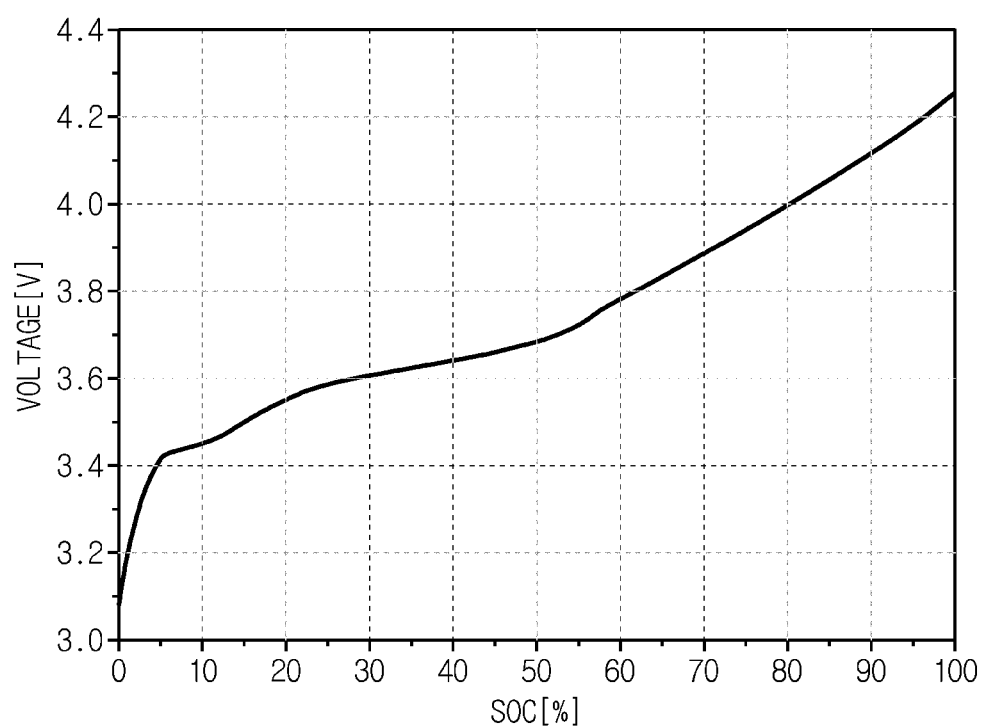
FIG. 2 is a graph showing a voltage of a battery according to a SOC of the battery.
Figure 3:
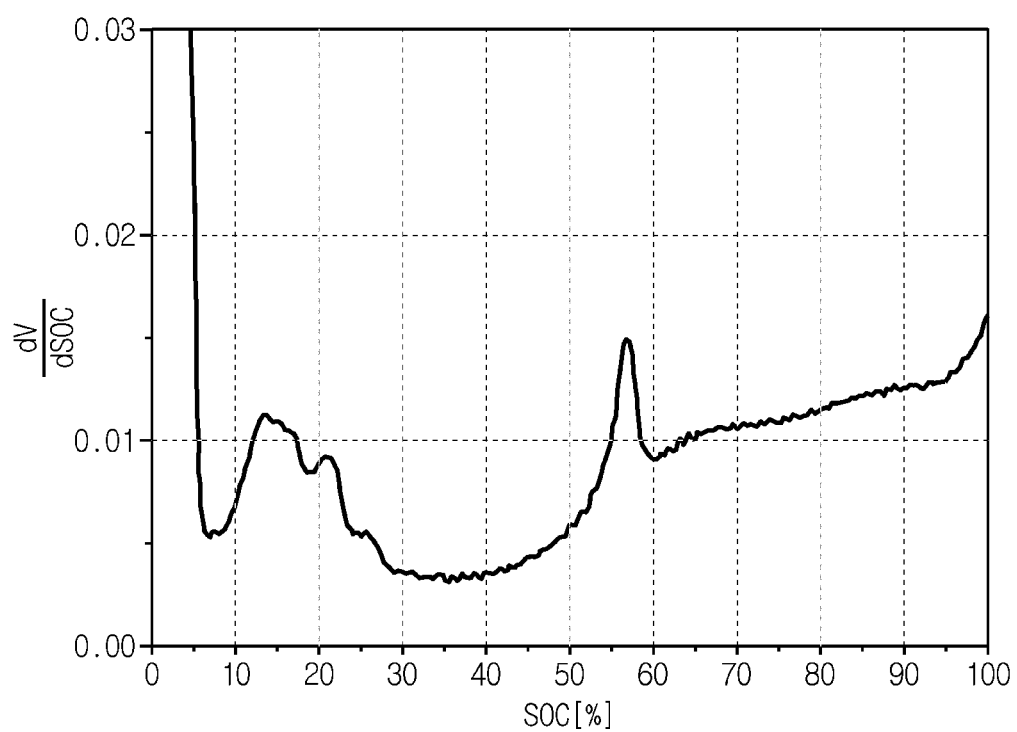
FIGS. 3 and 4 are voltage differential graphs of the battery according to the SOC of the battery before and after smoothing.
Figure 4:
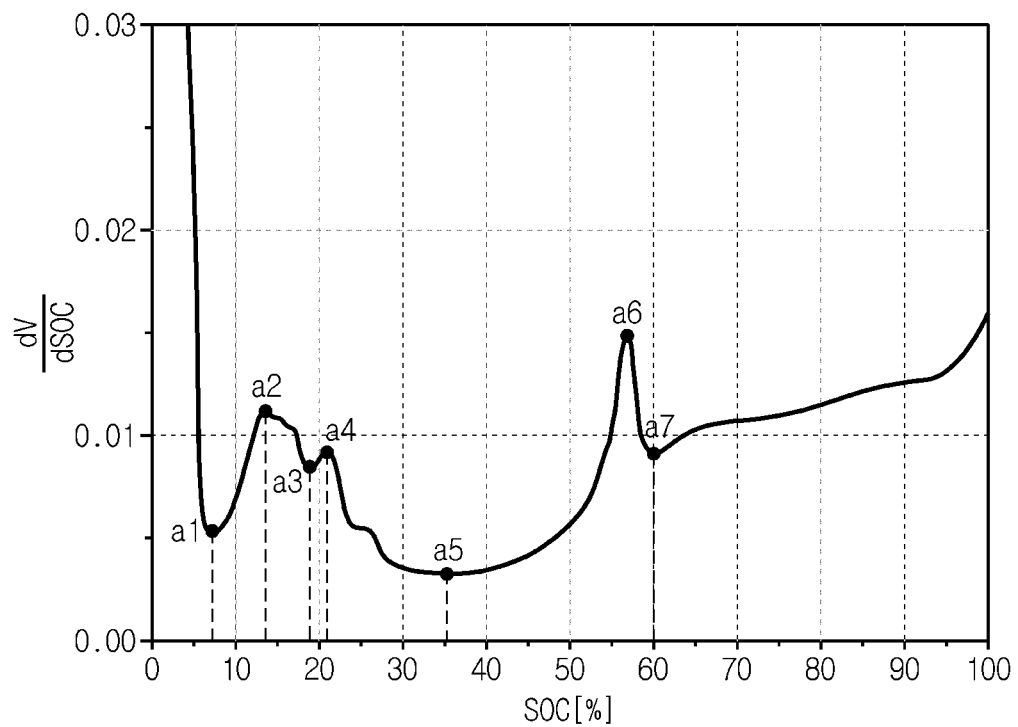
Figure 5:
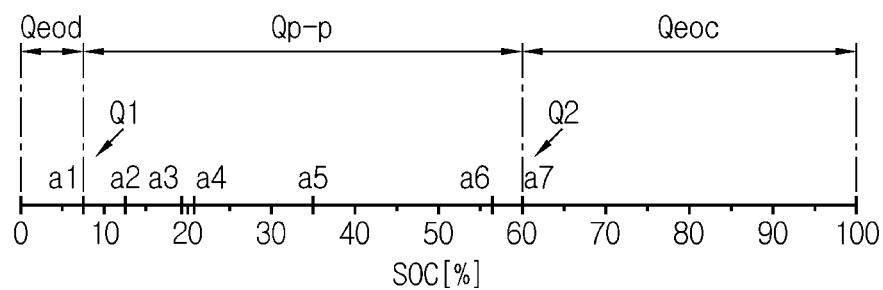
FIG. 5 is a diagram for illustrating a process in which a processor according to the present disclosure selects a first SOC and a second SOC and calculates a size of a first sub-region, a size of a second sub-region and a size of a third sub-region.

FIG. 1 is a diagram showing a battery diagnostic device according to an embodiment of the present disclosure, FIG. 2 is a graph showing a voltage of a battery according to a SOC of the battery, FIGS. 3 and 4 are voltage differential graphs of the battery according to the SOC of the battery before and after smoothing, and FIG. 5 is a diagram for illustrating a process in which a processor according to the present disclosure selects a first SOC and a second SOC and calculates a size of a first sub-region, a size of a second sub-region and a size of a third sub-region.

First, referring to FIG. 1, a battery diagnostic device 100 according to an embodiment of the present disclosure may be included in a battery pack 1 that has a battery B and may be connected to the battery B to diagnose a change of at least one of an active material area, a depth of discharge and a depth of charge of the battery B. For example, the active material area, the depth of discharge and the depth of charge of the battery B may be an active material area, a depth of discharge and a depth of charge of an electrode of the battery.

Meanwhile, the battery diagnostic device 100 according to an embodiment of the present disclosure may be included in a battery management system (BMS) provided in the battery pack 1.

The battery diagnostic device 100 may include a sensing unit 110, a memory unit 120, a processor 130 and a notifying unit 140.

The battery B is a minimum unit cell whose change of at least one of an active material area, a depth of discharge and a depth of charge is diagnosed, and includes a plurality of unit cells electrically connected in series and/or in parallel. Of course, the case where the battery pack B includes only one unit cell also falls into the scope of the present disclosure.

The unit cell is not limited to a particular type and includes any cell type that can be recharged repeatedly. For example, the unit cell may be a pouch-type lithium polymer battery.

The battery B may be electrically coupled to various types of external devices through an external terminal. The external device may be, for example, an electric vehicle, a hybrid electric vehicle, a flying object such as a drone, a large-capacity energy storage system (ESS) included in an electrical grid, or a mobile device. In this case, the battery B may include some or all unit cells included in a modularized battery pack mounted in the external device.

The external terminal of the battery B may be selectively coupled to a charging device. The charging device may be selectively coupled to the battery B by the control of the external device to which the battery pack B is mounted.

The sensing unit 110 is operably coupled to the processor 130. That is, the sensing unit 110 may be connected to the processor 130 to transmit an electrical signal to the processor 130 or receive an electrical signal from the processor 130.

The sensing unit 110 may repeatedly measure a voltage applied between a positive electrode and a negative electrode of the battery B and a current flowing into or out of the battery B at predetermined intervals, and provide a measurement signal indicating the measured voltage and current to the processor 130.

The sensing unit 110 includes a current sensor configured to measure the current of the battery B. Also, the sensing unit 110 may further include a voltage sensor configured to measure the voltage of the battery B. Though not shown in FIG. 1, the current sensor may be connected to both ends of a sense resistor connected to the battery B through a circuit. That is, the current sensor may measure a potential difference between both ends of the sense resistor and measure the current of the battery B based on the measured potential difference and the resistance value of the sense resistor.

When the processor 130 receives the measurement signal from the sensing unit 110, the processor 130 may determine a digital value of each of voltage and current of the battery through signal processing, and store the digital value in the memory unit 120.

The memory unit 120 is a semiconductor memory device that records, erases and updates data generated by the processor 130, and stores a plurality of program codes prepared for diagnosing a change of at least one of an active material area, a depth of discharge and a depth of charge of the battery B. In addition, the memory unit 120 may store preset values of various predetermined parameters used in implementing the present disclosure.

The memory unit 120 may is not particularly limited as long as it is a semiconductor memory element known in the art as being capable of recording, erasing and updating data. For example, the memory unit 120 may be dynamic random-access memory (DRAM), synchronous dynamic-random access memory (SDRAM), a flash memory, read-only memory (ROM), electrically erasable programmable read-only memory (EEPROM), a register, and the like. In addition, the memory unit 120 may further include a storage medium that stores program codes defining the control logics of the processor 130. The storage medium includes a non-volatile storage element such as a flash memory or a hard disk. The memory unit 120 may be physically separate from the processor 130 or may be integrated with the processor 130.

The processor 130 may control the current of the battery B so that the current of a preset charging current value is inputted to the battery B to charge the battery B, and estimate a SOC of the battery B based on the current input to the battery B.

At this time, the preset charging current value may be calculated using Equation 1 below.

$$I_C = \alpha \times C_n \quad \text{[Equation 1]}$$

Here, Ic may be a preset charging current value, $\alpha$ may be a constant of 1 or less, and Cn may be a rated current of the battery.

Accordingly, the processor 130 may estimate the SOC of the battery B which is charged by receiving the current having a charging current value equal to or less than the rated current.

Here, the SOC of the battery B may be a ratio of a charged capacity to the total capacity of the battery B.

The processor 130 may estimate the SOC of the battery B by using a current integration method that integrates current values of the current input to the battery B. That is, the processor 130 may estimate the SOC of the battery based on the current measured by the sensing unit 110.

Even though it has been described that the processor 130 estimates the SOC of the battery B by using the current integration method, the estimation method is not limited thereto as long as the SOC of the battery B to which the current of a preset charging current value is input can be estimated.

Meanwhile, the processor 130 may generate SOC-voltage data of the battery B by mapping the voltage of the battery B with the estimated SOC of the battery B. That is, the processor 130 may generate the SOC-voltage data of the battery B by mapping the voltage measured by the sensing unit 120 and the estimated SOC of the battery B with each other.

Here, the voltage of the battery B may be an open circuit voltage of the battery B.

The SOC-voltage data of the battery B may be expressed using a voltage curve of the battery B according to the SOC of the battery B, as shown in FIG. 2.

At this time, the memory unit 120 may store the SOC-voltage data of the battery B in at least one form of an approximation function that approximates the SOC-voltage data of the battery B to the battery curve of the battery B according to the SOC of the battery B and a lookup table where the voltage of the battery B is mapped with each SOC of the battery B.

The processor 130 may select a plurality of SOCs from the SOC-voltage data according to a predetermined condition. Specifically, the processor 130 may select a plurality of inflection points in the SOC-voltage data and select a SOC corresponding to each of the plurality of selected inflection points.

For example, in the embodiment of FIG. 2, the processor 130 may select a plurality of inflection points in the SOC-voltage curve that is expressed based on the SOC-voltage data of the battery B. Specifically, referring to FIG. 4, the processor 130 may select points a1 to a7 as the inflection points.

For example, the processor 130 may detect the SOC and the voltage of the battery B at a point where the change of the voltage of the battery B increases and then decreases according to a minute change of the SOC based on the SOC-voltage data as the inflection point. Also, the processor 130 may detect the SOC and the voltage of the battery B at a point where the change of the voltage of the battery B decreases and then increases according to the minute change of the SOC based on the SOC-voltage data as the inflection point. That is, the processor 130 may detect the SOC where a second-order derivative coefficient of an approximation function corresponding to the SOC-voltage data of the battery B is "0" and the voltage of the battery B corresponding to the SOC as the inflection point.

To this end, the processor 130 may calculate a first-order derivative by differentiating the approximation function corresponding to the SOC-voltage data of the battery B, as shown in FIG. 3.

After that, the processor 130 may remove noise components by smoothing the first-order derivative of the approximation function corresponding to the SOC-voltage data of the battery B, as shown in FIG. 4.

At this time, the processor 130 may smooth the first-order derivative of the approximation function corresponding to the SOC-voltage data of the battery B by using a noise filter.

In this way, the processor 130 may prevent false detection of the inflection point caused by noise components, thereby improving the accuracy of inflection point detection.

Subsequently, the processor 130 may calculate a second-order derivative by differentiating the first-order derivative of the smoothed approximation function, and detect the SOC where a function value of the calculated second-order derivative is "0" and the voltage of the battery B corresponding to the SOC as the inflection point.

For example, as shown in FIG. 4, the processor 130 may detect seven inflection points a1 to a7. Here, the SOC (X-axis value) corresponding to the seven inflection points a1 to a7 may be "7.2%", "13.6%", "19.1%", "21.2%", "35.3%", "56.8%" and "60.0%", respectively.

The processor 130 may divide the preset SOC region into a plurality of sub-regions based on the size of the plurality of selected SOCs. Specifically, the processor 130 may select a first SOC having the smallest size and a second SOC having the largest size among the plurality of selected SOCs. The processor 130 may divide the preset SOC region into the plurality of sub-regions based on points corresponding to the first SOC and the second SOC selected in the preset SOC region.

For example, the processor 130 may divide a region between the minimum value and the first SOC in the preset SOC region into a first sub-region, divide a region between the first SOC and the second SOC into a second sub-region, and divide a region between the second SOC and the maximum value into a third sub-region.

Here, the range of the preset SOC region may be limited a region from the minimum value to maximum value of the SOC estimated by the processor 130. For example, as shown in FIG. 2, the range of the preset SOC region may be limited to "0%" to "100%". Accordingly, the minimum value of the SOC region may be "0%", and the maximum value of the SOC region may be "100%".

For example, as shown in FIG. 5, the processor 130 may select the smallest SOC "7.2%" among the SOCs "7.2%", "13.6%", "19.1%", "21.2%", "35.3%", "56.8%" and "60.0%" corresponding to the detected seven inflection points a1 to a7 as the first SOC (Q1) and select the largest SOC "60.0%" as the second SOC (Q2).

After that, the processor 130 may divide the region of "0%" to "7.2%" into the first sub-region, divide the region of "7.2%" to "60.0%" into the second sub-region, and divide the region of "60.0%" to "100%" into the third sub-region. In addition, the processor 130 may calculate a difference value "7.2%" between the minimum value "0%" of the SOC region and the first SOC (Q1) "7.2%" as the size (Qeod) of the first sub-region. Also, the processor 130 may calculate a difference value 52.8% between the first SOC (Q1) "7.2%" and the second SOC (Q2) "60.0%" as the size (Qp-p) of the second sub-region. In addition, the processor 130 may calculate a difference value 40.0% between the second SOC (Q2) "60.0%" and the maximum value "100%" of the SOC region as the size (Qeoc) of the third sub-region.

The processor 130 may calculate a region change value for each sub-region based on the sizes of the first to third sub-regions and the size of a preset reference region.

Specifically, the processor 130 may calculate a second region change value by using the size of the second sub-region and the size of a second reference region. Also, the processor 130 may calculate a first region change value by using the size of the first sub-region, the size of a first reference region and the second region change value. In addition, the processor 130 may calculate a third region change value using the size of the third sub-region, the size of a third reference region and the second region change value.

The processor 130 may calculate the second region change value using Equation 2 below.

$$Q_{vp-p} = \left(\frac{Q_{p-p} - Q_{rp-p}}{Q_{rp-p}}\right) \times 100 \qquad \text{[Equation 2]}$$

Here, Qvp-p is the second region change value, Qrp-p is the size of the second reference region, and Qp-p is the size of the second sub-region.

For example, according to Equation 2, the processor 130 may calculate "−15.12%" as the second region change value (Qvp-p).

In addition, the processor 130 may calculate the first region change value by using the size of the first sub-region, the size of the first reference region, and the second region change value. Specifically, the processor 130 may calculate the first region change value using Equation 3 below.

$$Q_{veod} = \left(\frac{Q_{eod} - Q_{reod}}{Q_{reod}}\right) \times 100 - Q_{vp-p} \qquad \text{[Equation 3]}$$

Here, Qveod is the first region change value, Qreod is the size of the first reference region, Qeod is the size of the first sub-region, and Qvp-p is the second region change value.

For example, it is assumed that the size (Qreod) of the first reference region is "14%", the size (Qeod) of the first sub-region is "14.5%", and the second region change value (Qvp-p) is "−15.12%". First, the processor 130 may calculate a ratio of the difference between the size of the first sub-region and the size of the first reference region to the size of the first reference region by using Equation 3. That is, the processor 130 may calculate "3.57%" from the result of calculation "(14.5%−14%)/14%×100". In addition, the processor 130 may calculate the first region change value based on the difference between the calculated result and the second region change value. The processor 130 may calculate the first region change value (Qveod) "18.69%" from the result of calculation "3.57%−(−15.12%)".

In addition, the processor 130 may calculate the third region change value by using the size of the third reference region, the size of the third sub-region, and the second region change value. Specifically, the processor 103 may calculate the third region change value using Equation 4 below.

$$Q_{veoc} = \left(\frac{Q_{eoc} - Q_{reoc}}{Q_{reoc}}\right) \times 100 - Q_{vp-p} \qquad \text{[Equation 4]}$$

Here, Qveoc is the third region change value, Qreoc is the size of the third reference region, Qeoc is the size of the third sub-region, and Qvp-p is the second region change value.

For example, it is assumed that the size (Qreoc) of the third reference region is "43%", the size (Qeoc) of the third sub-region is "39%", and the second region change value (Qvp-p) is "−15.12%". First, the processor 130 may calculate a ratio of the difference between the size of the third sub-region and the size of the third reference region to the size of the third reference region by using Equation 4. That is, the processor 130 may calculate "−9.3%" from the result of calculation "(39%−43%)/43%×100". In addition, the processor 130 may calculate the third region change value based on the difference between the calculated result and the second region change value. The processor 130 may calculate the third region change value "5.82%" from the result of calculation "−9.3%−(−15.12%)".

After that, the processor 130 may diagnose the change of at least of the active material area, the depth of discharge and the depth of charge of the battery B according to the calculated change value of each of the plurality of sub-regions.

The processor 130 may diagnose the change of the depth of discharge of the battery B according to a region corresponding to the calculated first region change value in a preset predetermined depth-of-discharge change range. Also, the processor 130 may diagnose the change of the active material area of the battery B according to a region corresponding to the calculated second region change value in a preset predetermined active material area change range. In addition, the processor 130 may diagnose the change of the depth of charge of the battery B according to a region corresponding to the calculated third region change value in a preset predetermined depth-of-charge change range.

For example, all of the preset predetermined depth-of-discharge change range, the active material area change range and the depth-of-charge change range may be classified into ranges of "less than −10%", "−10% or above and 10% or below", "larger than 10%". In addition, in all of the preset predetermined depth-of-discharge change range, the active material area change range and the depth-of-charge change range, the region "less than −10%" may be diagnosed as a region that decreased below a BOL (Beginning Of Life) state, the region "−10% or above and 10% or below" may be diagnosed as a region that is identical to the BOL state, and the region "larger 10%" may be diagnosed as a region that increases over the BOL state.

For example, it is assumed as in the former embodiment that the first region change value is calculated as "18.69%", the second region change value is calculated as "−15.12%", and the third region change value is calculated as "5.82%". In this case, since the first region change value "18.69%" falls within the range "larger than 10%" in the preset predetermined depth-of-discharge change range, the processor 130 may diagnose that the depth of discharge of the battery B increases. Also, since the second region change value "−15.12%" belongs to the range "less than −10%" in the preset predetermined active material area change range, the processor 130 may diagnose that the active material area of the battery B decreases. In addition, since the third region change value "5.82%" belongs to the range "−10% or above and 10% or below" in the preset predetermined depth-of-charge change range, the processor 130 may diagnose that the depth of charge of the battery B is identical to the depth of charge of a battery B in the BOL state.

The processor 130 may be configured to diagnose the change of at least one of the active material area, the depth of discharge and the depth of charge of the battery B, and then determine whether the mode of the battery B is a normal mode or a failure mode based on the diagnosis result.

If it is determined that any one of the active material area, the depth of discharge and the depth of charge of the battery B is changed compared to the BOL state, the processor 130 may determine that the mode of the battery is a failure mode. Specifically, the processor 130 may determine that the mode of the battery is a failure mode if any one of the active material area, the depth of discharge and the depth of charge of the battery B does not belong to the region "−10% or above and 10% or below".

For example, it is assumed as in the former embodiment that the first region change value is calculated as "18.69%", the second region change value is calculated as "−15.12%", and the third region change value is calculated as "5.82%". In this case, the processor 130 may diagnose that the depth of discharge of the battery B is increased, the change of the active material area is decreased, and the depth of charge is identical to the BOL state. In addition, since the change of the active material area of the battery B is decreased and the depth of discharge is increased, the processor 130 may determine that the mode of the battery is a failure mode. Namely, the processor 130 may determine that the mode of the battery B is a failure mode if it is determined that any one of the change of the active material area, the change of the depth of discharge and the change of the depth of charge associated with degradation of the battery B is increased or decreased compared to the BOL state.

The processor 130 may determine the mode of the battery B and then set the mode of the battery B as the determined mode. For example, if the mode of the battery B is determined as a failure mode, the processor 130 may set the mode of the battery B to the failure mode. Conversely, if the mode of the battery B is determined as a normal mode, the processor 130 may set the mode of the battery B to the normal mode.

Thus, the battery diagnostic device according to an embodiment of the present disclosure may correctly diagnose the cause of battery degeneration and determine the mode of the battery as any one of a normal mode and a failure mode depending on the cause of degeneration. In addition, if it is determined that any one of the change of the active material area, the change of the depth of discharge and the change of the depth of charge is increased or decreased compared to the BOL state, the battery diagnostic device may determine that the battery mode is a failure mode and prevent an unexpected problem that may be caused due to the degradation of the battery such as overdischarge and overcharge.

Hereinafter, an example of a process that the processor 130 diagnoses the change of at least one of the active material area, the depth of discharge and the depth of charge of the battery B will be described in more detail with reference to FIGS. 6 and 7.

Figure 6:
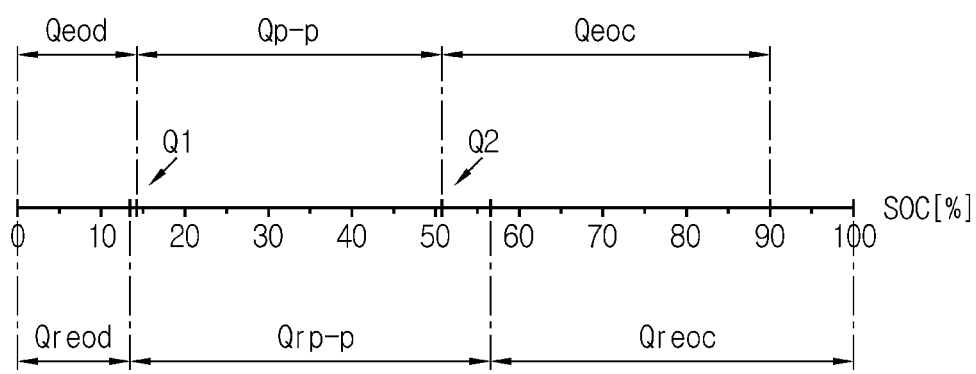
FIG. 6 is a diagram for illustrating an example of a process in which a processor according to another embodiment of the present disclosure diagnoses a battery.

FIG. 6 is a diagram for illustrating an example of a process in which a processor 130 according to another embodiment of the present disclosure diagnoses a battery. Here, it should be noted that the size (Qeod) of the first sub-region, the size (Qp-p) of the second sub-region and the size (Qeoc) of the third sub-region are depicted at an upper side based on an axis (SOC) in FIG. 6, and the size of the SOC of the battery B in the BOL state is depicted in a lower side based on the axis (SOC).

As shown in FIG. 6, it is assumed that the minimum value of the SOC region is "0%" and the maximum value is decreased to "90%" according to the SOC-voltage data due to the degradation of the battery B. In addition, if it is assumed that the first SOC (Q1) and the second SOC (Q2) of the battery B are respectively "14.5%" and "51%", the processor 130 may calculate the size (Qeod) of the first sub-region, the size (Qp-p) of the second sub-region and the size (Qeoc) of the third sub-region as "14.5%", "36.5%" and "39%", respectively. At this time, if the size (Qeod) of the first sub-region, the size (Qp-p) of the second sub-region and the size (Qeoc) of the third sub-region are respectively "14%", "43%" and "43%", the processor 130 may calculate the first region change value, the second region change value and the third region change value as "18.69%", "−15.12%" and "5.82%", respectively.

For example, the processor 130 may calculate the second region change value as "−15.12%" by computing "(36.5%−43%)÷43%×100" using Equation 2. In addition, the processor 130 may calculate the first region change value as "18.69%" by computing "{(14.5%−14%)÷14%×100}−(−15.12%)" using Equation 3. In addition, the processor 130 may calculate the third region change value as "5.82%" by computing "{(39%−43%)÷43%×100}−(−15.12%)" using Equation 4.

The processor 130 may diagnose the change of the depth of discharge of the battery B depending on a region of the preset predetermined depth-of-discharge change range to which the first region change value "18.69%" belongs. The preset predetermined depth-of-discharge change range may include a first reference change rate range, a second reference change rate range and a third reference change rate range. Here, the first reference change rate range may be a region of "less than −10%", the second reference change rate range may be a region of "−10% or above and 10% or below", and the third reference change rate range may be a region "larger than 10%".

The processor 130 may determine that the first region change value "18.69%" falls within the third reference change rate range "larger than 10%" and diagnose that the depth of discharge of the battery B is increased.

The processor 130 may diagnose the change of the active material area of the battery B depending on a region of the preset predetermined active material area change range to which the second region change value "−15.12%" belongs. The preset predetermined active material area change range may include a fourth reference change rate range, a fifth reference change rate range and a sixth reference change rate range. Here, the fourth reference change rate range may be a range of "less than −10%", the fifth reference change rate range may be a range of "−10% or above and 10% or below", and the sixth reference change rate range may be a range of "larger than 10%".

The processor 130 may determine that the second region change value "−15.12%" is included in the fourth reference change rate range "less than −10%", and diagnose that the active material area of the battery B is decreased.

The processor 130 may diagnose the change of the depth of charge of the battery B depending on a region of the preset predetermined depth-of-charge change range to which the third region change value "5.82%" belongs. The preset predetermined depth-of-charge change range may include a seventh reference change rate range, an eighth reference change rate range and a ninth reference change rate range. Here, the seventh reference change rate range may be a region of "less than −10%", the eighth reference change rate range may be a region of "−10% or above and 10% or below", and the ninth reference change rate range may be a region of "larger than 10%".

The processor 130 may determine that the third region change value "5.82%" is included in the eighth reference change rate range "−10% or above and 10% or below", and diagnose that the depth of charge of the battery B is identical to that of the battery B in the BOL state. In other words, the processor 130 may diagnose that the depth of charge of the battery B is identical to the depth of charge of the battery B in the BOL state. Namely, the processor 130 may diagnose that the depth of charge of the battery B is not changed from the depth of charge of the battery B in the BOL state.

Even though the processor 130 diagnoses that the depth of charge of the battery B is not changed from the depth of charge in the BOL state, since it is diagnosed that the depth of discharge is increased and the active material area is decreased, the processor 130 may determine that the mode of the battery B is a failure mode. That is, since it is diagnosed that the depth of discharge and the active material area are changed, the processor 130 may determine the mode of the battery B as a failure mode.

In other words, the battery diagnostic device according to an embodiment of the present disclosure may diagnose a change of the internal factors as the battery B degrades, and determine the battery state as a normal mode or a failure mode according to the diagnosis result. Thus, the battery B is operated according to the determined mode to prevent unexpected problems such as overcharge and overdischarge in advance.

Hereinafter, another example of the process that the processor 130 diagnoses the change of at least one of the active material area, the depth of discharge and the depth of charge of the battery B will be described.

Figure 7:
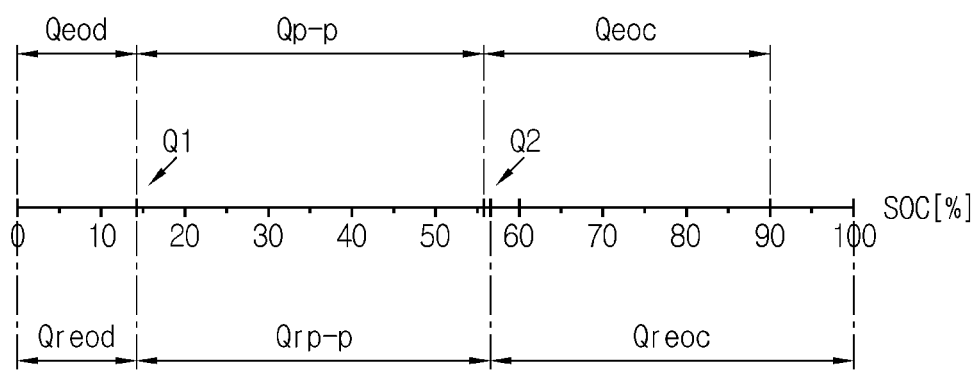
FIG. 7 is a diagram for illustrating another example of the process in which a processor according to another embodiment of the present disclosure diagnoses a battery.

FIG. 7 is a diagram for illustrating another example of the process in which the processor 130 according to another embodiment of the present disclosure diagnoses a battery. Here, it should be noted that the size (Qeod) of the first sub-region, the size (Qp-p) of the second sub-region and the size (Qeoc) of the third sub-region are depicted at an upper side based on an axis (SOC) in FIG. 7, and the size of the SOC of the battery B in the BOL state is depicted in a lower side based on the axis (SOC).

As shown in FIG. 7, it is assumed that the minimum value of the SOC region is "0%" and the maximum value is decreased to "90%" according to the measured SOC-voltage data of the battery B, and the first SOC (Q1) and the second SOC (Q2) of the battery B are respectively selected as "14%" and "56%". The processor 130 may calculate the size (Qeod) of the first sub-region, the size (Qp-p) of the second sub-region and the size (Qeoc) of the third sub-region as "14%", "42%" and "34%", respectively.

If the size (Qeod) of the first sub-region, the size (Qp-p) of the second sub-region and the size (Qeoc) of the third sub-region are "14%", "42%" and "34%", respectively, the processor 130 may calculate the first region change value, the second region change value and the third region change value as "2.33%", "−2.33%" and "−18.60%", respectively.

For example, the processor 130 may calculate the second region change value as "−2.33%" by computing "(42%−43%)÷43%×100" using Equation 2. In addition, the processor 130 may calculate the first region change value as "2.33%" by computing "{(14%−14%)÷14%×100}−(−2.33%)" using Equation 3. In addition, the processor 130 may calculate the third region change value as "−18.60%" by computing "{(34%−43%)÷43%×100}−(−2.33%)" using Equation 4.

The processor 130 may diagnose the change of the depth of discharge of the battery B depending on a region of the preset predetermined depth-of-discharge change range to which the first region change value "2.33%" belongs. The processor 130 may determine that the first region change value "2.33%" falls within the second reference change rate range "−10% or above and 10% or below" and diagnose that the depth of discharge of the battery B is identical to the depth of discharge of the battery B in the BOL state.

The processor 130 may diagnose the change of the active material area of the battery B depending on a region of the preset predetermined active material area change range to which the second region change value "−2.33%" belongs. The processor 130 may determine that the second region change value "−2.33%" is included in the fifth reference change rate range "−10% or above and 10% or below", and diagnose that the active material area of the battery B is identical to the active material area of the battery B in the BOL state.

The processor 130 may diagnose the change of the depth of charge of the battery B depending on a region of the preset predetermined depth-of-charge change range to which the third region change value "−18.60%" belongs. The processor 130 may determine that the third region change value "−18.60%" is included in the seventh reference change rate range "less than −10%", and diagnose that the depth of charge of the battery B is decreased compared to the depth of charge of the battery B in the BOL state.

Even though the processor 130 diagnoses that the depth of discharge and the active material area of battery B are not changed, since it is diagnosed that the depth of charge is decreased, the processor 130 may determine that the mode of the battery B is a failure mode.

According to the configuration of the present disclosure, it is possible to accurately diagnose the cause of the decrease in the maximum value of the SOC region of the battery B by the changes of the active material area, the depth of discharge and the depth of charge of the battery B.

The processor 130 may transmit a message indicating the diagnosis result to the external device through a communication terminal (COM).

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

The notifying unit 140 may receive and output the diagnosis results obtained by the processor 130 to the outside. More specifically, the notifying unit 140 may include at least one of a display unit for displaying the diagnosis result by using at least one of symbols, numbers and codes, and a speaker unit for outputting the diagnosis result with a sound.

Meanwhile, a battery management system according to the present disclosure may include the battery diagnostic device 100 described above. By doing so, it is possible to diagnose the change of at least one of the active material area, the depth of discharge and the depth of charge of a battery managed by the battery management system.

Figure 8:
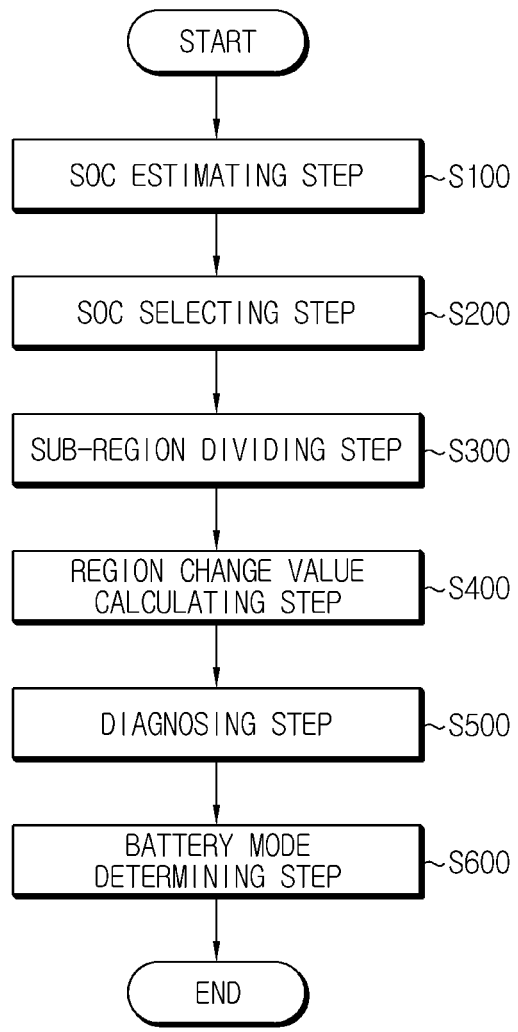
FIG. 8 is a flowchart for schematically illustrating a battery diagnostic method according to still another embodiment of the present disclosure.

FIG. 8 is a flowchart for schematically illustrating a battery diagnostic method according to still another embodiment of the present disclosure. Hereinafter, a battery diagnosis method according to an embodiment of the present disclosure is described with reference to FIG. 8.

The battery diagnostic method may include a SOC estimating step S100, a SOC selecting step S200, a sub-region dividing step S300, a region change value calculating step S400, a diagnosing step S500 and a determining step S600 as operations performed by the battery diagnostic device.

The SOC estimating step S100 is a step of measuring a current and voltage of a battery B and estimating a SOC of the battery B based on the measured current. Based on the current of the battery B measured by the sensing unit 120, the processor 130 may estimate the SOC of the battery B.

First, the sensing unit 120 may measure the voltage and current of the battery B and transmit the measured voltage value and the measured current value to the processor 130. The processor 130 may receive the voltage value and the current value from the sensing unit 120 and estimate the SOC of the battery B based on the received current value.

The SOC selecting step S200 is a step of selecting a plurality of SOCs according to a predetermined condition from SOC-voltage data where the measured voltage and the estimated SOC are mapped with each other. That is, the selecting SOC step S200 is a step of selecting a plurality of SOCs satisfying a predetermined condition among the estimated SOC of the battery B and may be performed by the processor 130.

The processor 130 may obtain the SOC-voltage data where the voltage value received from the sensing unit 120 and the estimated SOC are mapped with each other, and extract a plurality of inflection points from the obtained SOC-voltage data. After that, the processor 130 may select SOCs of the plurality of inflection points that satisfy the predetermined condition among the plurality of extracted inflection points.

For example, the processor 130 may select a first inflection point having the smallest SOC size and a second inflection point having the largest SOC size among the plurality of extracted inflection points. In addition, the processor 130 may select a first SOC of the first inflection point and a second SOC of the second inflection point.

The sub-region dividing step S300 is a step of dividing a preset SOC region into a plurality of sub-regions based on the size of the plurality of selected SOCs. That is, the sub-region dividing step S300 is a step of dividing the preset SOC region into a plurality of sub-regions based on the selected first SOC and the selected second SOC and may be performed by the processor 130.

The processor 130 may divide the preset SOC region into a first sub-region, a second sub-region and a third sub-region. For example, the processor 130 may divide the region from the minimum value of the preset SOC region to the first SOC as the first sub-region, divide the region from the first SOC to the second SOC into the second sub-region, and divide the region from the second sub-region to the maximum value of the preset SOC region into the third sub-region.

At this time, the minimum value and the maximum value of the preset SOC region may vary depending on the degradation degree of the battery B.

The region change value calculating step S400 is a step of calculating a region change value for each of the plurality of sub-regions based on the size of each of the plurality of sub-regions and the size of a preset reference region and may be performed by the processor 130.

The processor 130 may calculate the size of each of the plurality of divided sub-regions. For example, it is assumed that the minimum value of the preset SOC region is "0%", the maximum value is "90%", the first SOC is "14%", and the second SOC is "56%". The processor 130 may calculate the size of the first sub-region as "14%", calculate the size of the second sub-region as "42%", and calculate the size of the third sub-region as "34%".

After that, the processor 130 may calculate the region change value of each sub-region based on the size of the preset reference region and the calculated size of each sub-region. At this time, the processor 130 may calculate the second region change value of the second sub-region by using the Equation 2, calculate the first region change value of the first sub-region by using the Equation 3, and calculate the third region change value of the third sub-region by using the Equation 4.

The diagnosing step S500 is a step of diagnosing the change of at least one of the active material area, the depth of discharge and the depth of charge of the battery B according to the calculated region change value of each of the plurality of sub-regions. The diagnosing step S500 may be performed by the processor 130.

The processor 130 may compare the calculated first region change value, the calculated second region change value and the calculated third region change value with the preset range, respectively, and diagnose the change of the depth of discharge, the active material area and the depth of charge of the battery B according to the comparison result.

Specifically, the processor 130 may diagnose the change of the depth of discharge of the battery B according to the region where the calculated first region change value belongs to the preset depth-of-discharge change range. In addition, the processor 130 may diagnose the change of the active material area of the battery B according to the region where the calculated second region change value belongs to the preset active material area change range. Also, the processor 130 may diagnose the change of the depth of charge of the battery B according to the region where the calculated third region change value belongs to the preset depth-of-charge change range.

The determining step S600 is a step of determining the mode of the battery B as a normal mode or a failure mode based on the diagnosis result, and may be performed by the processor 130.

If it is diagnosed that at least one of the depth of discharge, the active material area and the depth of charge of the battery B is changed, the processor 130 may determine that the mode of the battery B is a failure mode. Specifically, the processor 130 may determine that the mode of the battery B is a failure mode if it is diagnosed that at least one of the depth of discharge, the active material area and the depth of charge of the battery B is increased or decreased compared to the BOL state. That is, if the diagnosis result of the depth of discharge, the active material area and the depth of charge of the battery B corresponds to at least one of a case where the depth of discharge of the battery B is increased or decreased compared to the depth of discharge of the battery B in the BOL state, a case where the active material area of the battery B is increased or decreased compared to the active material area of the battery B in the BOL state and a case where the depth of charge of the battery B is increased or decreased compared to the depth of charge of the battery B in the BOL state, the processor 130 may determine that the mode of the battery B is a failure mode.

For example, as battery B degrades, various problems such as lithium plating and swelling phenomenon as well as overdischarge and overcharge may occur. Thus, if it is diagnosed that any one of the depth of discharge, the active material area change and the depth of charge of the battery B is increased or decreased compared with that of the battery B in the BOL state, the processor 130 determines that the mode of the battery B is a failure mode, thereby preventing unexpected problems that might occur at the battery B in advance.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
B: battery
100: battery diagnostic device
110: sensing unit
120: memory unit
130: processor
140: notifying unit

What is claimed is:
1. A battery diagnostic device, comprising:
one or more sensors configured to measure a current and voltage of a battery; and
a processor configured to:
  estimate an estimated State of Charge (SOC) of the battery based on the current measured by the one or more sensors;
  obtain SOC-voltage data from the measured voltage and the estimated SOC, wherein the SOC-voltage data maps the voltage measured by the one or more sensors with the estimated SOC;
  after obtaining the SOC-voltage data, select a plurality of selected SOCs from the obtained SOC-voltage data according to one or more predetermined conditions;
  define a plurality of non-overlapping sub-regions based on respective SOC values of the plurality of selected SOCs, wherein each sub-region includes a range of SOC values between adjacent selected SOCs of the SOC-voltage data;
  for each sub-region, calculate a region change value of the sub-region based on a difference between SOCs values of the adjacent selected SOCs defining the sub-region and a range of SOC values of a preset reference region corresponding to the sub-region, wherein the region change value of each sub-region is calculated based on a different preset reference region;
  determine whether at least one of an active material area, a depth of discharge or a depth of charge of the battery is changed based on the calculated region change values of the plurality of sub-regions; and
  determine a mode of the battery based on whether at least one of the active material area, the depth of charge or the depth of discharge is changed, wherein the mode of the battery is one of a normal mode or a failure mode.

2. The battery diagnostic device according to claim 1, wherein the processor is configured to:
  obtain a SOC-voltage curve from the SOC-voltage data;
  extract a plurality of inflection points from the obtained SOC-voltage curve; and
  select the plurality of selected SOCs from at least some of the plurality of extracted inflection points.

3. The battery diagnostic device according to claim 1, wherein the plurality of sub-regions includes a first sub-region, a second sub-region and a third sub-region, and wherein the processor is configured to:
  select a SOC having a lowest SOC value among the plurality of selected SOCs as a first SOC;
  select a SOC having a highest SOC value among the plurality of selected SOCs as a second SOC; and
  divide the preset SOC region into the first sub-region, the second sub-region and the third sub-region based on points corresponding to the first SOC and the second SOC.

4. The battery diagnostic device according to claim 3, wherein the processor is configured to:
calculate a second region change value based on a difference between a difference between SOC values of the adjacent selected SOCs defining the second sub-region and a range of SOC values of a preset second reference region; and
determine whether the active material area of the battery is changed based on the calculated second region change value.

5. The battery diagnostic device according to claim 4, wherein the processor is configured to calculate the second region change value according to:

$$Q_{vp-p} = \left(\frac{Q_{p-p} - Q_{rp-p}}{Q_{rp-p}}\right) \times 100$$

wherein Qvp-p is the second region change value, Qp-p is the difference between SOCs values of the adjacent selected SOCs defining the second sub-region, and Qrp-p is the range of SOC values of the preset second reference region.

6. The battery diagnostic device according to claim 4, wherein the processor is configured to:
determine whether the active material area of the battery is changed based on whether the calculated second region change value is within a preset predetermined active material area change range; and
determine that the mode of the battery is a failure mode when it is determined that the active material area is changed.

7. The battery diagnostic device according to claim 4, wherein the processor is configured to:
calculate a first region change value based on a difference between SOC values of the adjacent selected SOCs defining the first sub-region, a range of SOC values of a preset first reference region and the calculated second region change value; and
determine whether the depth of discharge of the battery is changed based on the calculated first region change value.

8. The battery diagnostic device according to claim 7, wherein the processor is configured to calculate the first region change value according to:

$$Q_{veod} = \left(\frac{Q_{eod} - Q_{reod}}{Q_{reod}}\right) \times 100 - Q_{vp-p}$$

wherein Qveod is the first region change value, Qeod is the difference between SOCs values of the adjacent selected SOCs defining the first sub-region, Qreod is the range of SOC values of the preset first reference region, and Qvp-p is the second region change value.

9. The battery diagnostic device according to claim 7, wherein the processor is configured to:
determine whether the change of the depth of discharge of the battery is changed based on whether the calculated first region change value is within a preset predetermined depth-of-discharge change range; and
determine that the mode of the battery is a failure mode when it is determined that the depth of discharge is changed.

10. The battery diagnostic device according to claim 4, wherein the processor is configured to:
calculate a third region change value based on a difference between SOC values of the adjacent selected SOCs defining the third sub-region, a range of SOC values of a preset third reference region and the calculated second region change value; and
determine whether the depth of charge of the battery is changed based on the calculated third region change value.

11. The battery diagnostic device according to claim 10, wherein the processor is configured to calculate the third region change value according to:

$$Q_{veoc} = \left(\frac{Q_{eoc} - Q_{reoc}}{Q_{reoc}}\right) \times 100 - Q_{vp-p}$$

wherein Qveoc is the third region change value, Qeoc is the difference between SOCs values of the adjacent selected SOCs defining the third sub-region, Qreoc is the range of SOC values of the preset third reference region, and Qvp-p is the second region change value.

12. The battery diagnostic device according to claim 10, wherein the processor is configured to:
determine whether the change of the depth of charge of the battery is changed based on whether the calculated third region change value is within a preset predetermined depth-of-charge change range; and
determine that the mode of the battery is a failure mode when it is determined that the depth of charge is changed.

13. A battery management system, comprising the battery diagnostic device according to claim 1.

14. A battery pack, comprising the battery diagnostic device according to claim 1.

15. The battery diagnostic device according to claim 1, wherein the processor is configured to:
estimate a maximum value of the SOC; and
determine a preset SOC region based on a minimum value of the SOC and the estimated maximum value of the SOC; and
define the plurality of non-overlapping sub-regions within the preset SOC region.

16. A battery diagnostic method, comprising:
measuring a current and voltage of a battery;
estimating an estimated SOC of the battery based on the measured current;
obtaining SOC-voltage data from the measured voltage and the estimated SOC, wherein the SOC-voltage data maps the voltage measured by the one or more sensors with the estimated SOC;
after obtaining the SOC-voltage data, selecting a plurality of selected SOCs from the obtained SOC-voltage data according to one or more predetermined conditions;
defining a plurality of non-overlapping sub-regions based on respective SOC values of the plurality of selected SOCs, wherein each sub-region includes a range of SOC values between adjacent selected SOCs of the SOC-voltage data;
for each sub-region, calculating a region change value of the sub-region based on a difference between SOCs values of the adjacent selected SOCs defining the sub-region and a range of SOC values of a preset reference region corresponding to the sub-region, wherein the region change value of each sub-region is calculated based on a different preset reference region;

determine whether at least one of an active material area, a depth of discharge or a depth of charge of the battery is changed based on the calculated region change values of the plurality of sub-regions; and determining a mode of the battery based on whether at least one of the active material area, the depth of charge or the depth of discharge is changed, wherein the mode of the battery is one of a normal mode or a failure mode.

* * * * *